(12) United States Patent
Kim et al.

(10) Patent No.: US 9,997,446 B2
(45) Date of Patent: Jun. 12, 2018

(54) SEMICONDUCTOR PACKAGE INCLUDING A REWIRING LAYER WITH AN EMBEDDED CHIP

(71) Applicant: SAMSUNG ELECTRONICS CO., LTD., Suwon-si, Gyeonggi-Do (KR)

(72) Inventors: Ji-Hwang Kim, Cheonan-si (KR); Jong-Bo Shim, Asan-si (KR); Cha-Jea Jo, Yongin-si (KR); Won-Il Lee, Hwaseong-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days. days.

(21) Appl. No.: 15/468,294

(22) Filed: Mar. 24, 2017

(65) Prior Publication Data

US 2018/0040548 A1 Feb. 8, 2018

(30) Foreign Application Priority Data

Aug. 5, 2016 (KR) .................. 10-2016-0100126

(51) Int. Cl.
| | |
|---|---|
| H01L 23/48 | (2006.01) |
| H01L 23/52 | (2006.01) |
| H01L 29/40 | (2006.01) |
| H01L 23/498 | (2006.01) |
| H01L 25/065 | (2006.01) |
| H01L 23/31 | (2006.01) |
| H01L 23/00 | (2006.01) |
| H01L 25/00 | (2006.01) |

(52) U.S. Cl.
CPC .... *H01L 23/49838* (2013.01); *H01L 23/3128* (2013.01); *H01L 23/49827* (2013.01); *H01L 24/09* (2013.01); *H01L 25/0652* (2013.01); *H01L 25/0657* (2013.01); *H01L 25/50* (2013.01); *H01L 2224/0401* (2013.01); *H01L 2225/06513* (2013.01); *H01L 2225/06517* (2013.01); *H01L 2225/06562* (2013.01); *H01L 2225/06586* (2013.01)

(58) Field of Classification Search
CPC . H01L 2224/32145; H01L 2224/16145; H01L 25/0657; H01L 25/0652; H01L 21/6802
USPC .................. 257/686, 777, 723, 724
See application file for complete search history.

(56) References Cited

U.S. PATENT DOCUMENTS

| | | |
|---|---|---|
| 7,319,043 B2 | 1/2008 | Yang et al. |
| 7,402,901 B2 | 7/2008 | Hatano et al. |
| 7,446,546 B2 | 11/2008 | Yang et al. |

(Continued)

*Primary Examiner* — S. V. Clark
(74) *Attorney, Agent, or Firm* — F. Chau & Associates, LLC

(57) ABSTRACT

A semiconductor package includes a substrate, a rewiring layer, a plurality of semiconductor chip stack structures, and a second semiconductor chip. The rewiring layer is disposed on an upper surface of the substrate. The rewiring layer includes a concave portion. The semiconductor chip stack structures include a plurality of first semiconductor chips. The first semiconductor chips are disposed on the rewiring layer. The first semiconductor chips are spaced apart from each other in a horizontal direction. The second semiconductor chip is disposed within the concave portion. The second semiconductor chip is configured to electrically connect each of the plurality of semiconductor chip stack structures to each other.

19 Claims, 11 Drawing Sheets

(56) References Cited

U.S. PATENT DOCUMENTS

| | | | |
|---|---|---|---|
| 8,188,581 B2* | 5/2012 | Shi | H01L 23/13 |
| | | | 257/673 |
| 8,227,904 B2* | 7/2012 | Braunisch | H01L 23/13 |
| | | | 257/686 |
| 8,406,759 B2 | 3/2013 | Ryan et al. | |
| 8,901,748 B2* | 12/2014 | Manusharow | H01L 25/0655 |
| | | | 257/652 |
| 8,946,900 B2 | 2/2015 | Qian et al. | |
| 8,971,053 B2 | 3/2015 | Kariya et al. | |
| 9,108,841 B1 | 8/2015 | Bowles et al. | |
| 9,147,663 B2 | 9/2015 | Liu et al. | |
| 9,257,393 B1 | 2/2016 | Gong et al. | |
| 2010/0327424 A1* | 12/2010 | Braunisch | H01L 23/13 |
| | | | 257/692 |
| 2011/0285006 A1* | 11/2011 | Weng | H01L 23/13 |
| | | | 257/686 |
| 2013/0207261 A1* | 8/2013 | Thacker | H01L 24/72 |
| | | | 257/738 |
| 2014/0077364 A1 | 3/2014 | Marimuthu et al. | |
| 2015/0001717 A1 | 1/2015 | Karhade et al. | |
| 2015/0206816 A1 | 7/2015 | Woo et al. | |
| 2015/0251903 A1 | 9/2015 | Bowles et al. | |
| 2015/0380386 A1 | 12/2015 | Vincent et al. | |
| 2016/0013076 A1 | 1/2016 | Vincent et al. | |
| 2016/0071818 A1* | 3/2016 | Wang | H01L 25/0655 |
| | | | 257/774 |
| 2016/0073496 A1 | 3/2016 | Vincent | |
| 2016/0079196 A1 | 3/2016 | Teh et al. | |
| 2016/0086930 A1 | 3/2016 | Koey et al. | |
| 2016/0093571 A1 | 3/2016 | Kim et al. | |
| 2016/0118313 A1 | 4/2016 | Gong et al. | |
| 2016/0133552 A1 | 5/2016 | Roy et al. | |
| 2016/0379959 A1* | 12/2016 | We | H01L 25/0652 |
| | | | 257/773 |

\* cited by examiner

SEMICONDUCTOR PACKAGE INCLUDING A REWIRING LAYER WITH AN EMBEDDED CHIP

CROSS-REFERENCE TO RELATED APPLICATION

This application claims priority under 35 U.S.C. § 119 to Korean Patent Application No. 10-2016-0100126, filed on Aug. 5, 2016 in the Korean Intellectual Property Office, the disclosure of which is incorporated by reference herein in its entirety.

TECHNICAL FIELD

The present inventive concept relates to a semiconductor package, and more particularly, a semiconductor package including a rewiring layer with a semiconductor chip embedded therein.

DISCUSSION OF RELATED ART

A semiconductor package may have a relatively high capacity and a relatively small size. To increase capacity of a semiconductor chip, technology for manufacturing the semiconductor chip including more cells in a relatively limited space is required. However, technology may need an advanced technique such as a precise fine line width. Thus, a method of implementing a relatively high integration using a semiconductor chip or a semiconductor package, for example, a multi-chip stacked package or a stack type semiconductor package in which semiconductor chips are stacked in a 3-dimensional manner may be desirable.

SUMMARY

Exemplary embodiments of the present inventive concept provide a semiconductor package, and more particularly a semiconductor package that may increase a yield of a printed circuit board (PCB), reduce manufacturing expenses, and minimize a warpage of a rewiring layer.

According to an exemplary embodiment of the present inventive concept a semiconductor package is provided. The semiconductor package includes a substrate, a rewiring layer, a plurality of semiconductor chip stack structures, and a second semiconductor chip. The rewiring layer is disposed on an upper surface of the substrate. The rewiring layer includes a concave portion. The semiconductor chip stack structures include a plurality of first semiconductor chips. The semiconductor chips are disposed on the rewiring layer. The semiconductor chips are spaced apart from each other in a horizontal direction. The second semiconductor chip is disposed within the concave portion. The second semiconductor chip is configured to electrically connect the plurality of semiconductor chip stack structures to each other.

According to an exemplary embodiment of the present inventive concept, a semiconductor package is provided. The semiconductor package includes a substrate, a plurality of semiconductor chip stack structures, a first rewiring layer, and a bridge layer. The substrate is formed at a first level. The semiconductor chip stack structures are formed at a third level. The semiconductor chip stack structures are spaced apart from each other in a horizontal direction. The first rewiring layer is formed at a second level. The second level is disposed between the first level and the third level. The first rewiring layer electrically connects the substrate and at least one of the semiconductor chip stack structures. The bridge layer is formed at the second level. The bridge layer electrically connects at least one of the semiconductor chip stack structures.

According to an exemplary embodiment of the present inventive concept, a semiconductor package is provided. The semiconductor package includes a substrate, a rewiring layer, a plurality of semiconductor chip stack structures, and a second semiconductor chip. The rewiring layer is disposed on the substrate. The rewiring layer includes a concave portion. The semiconductor chip stack structures are disposed on the rewiring layer. The second semiconductor chip is disposed within the concave portion. The second semiconductor chip is configured to electrically connect the semiconductor chip stack structures to each other.

BRIEF DESCRIPTION OF THE DRAWINGS

Exemplary embodiments of the present inventive concept will be more clearly understood from the following detailed description taken in conjunction with the accompanying drawings, in which.

DETAILED DESCRIPTION OF THE EMBODIMENTS

Figure 1A:
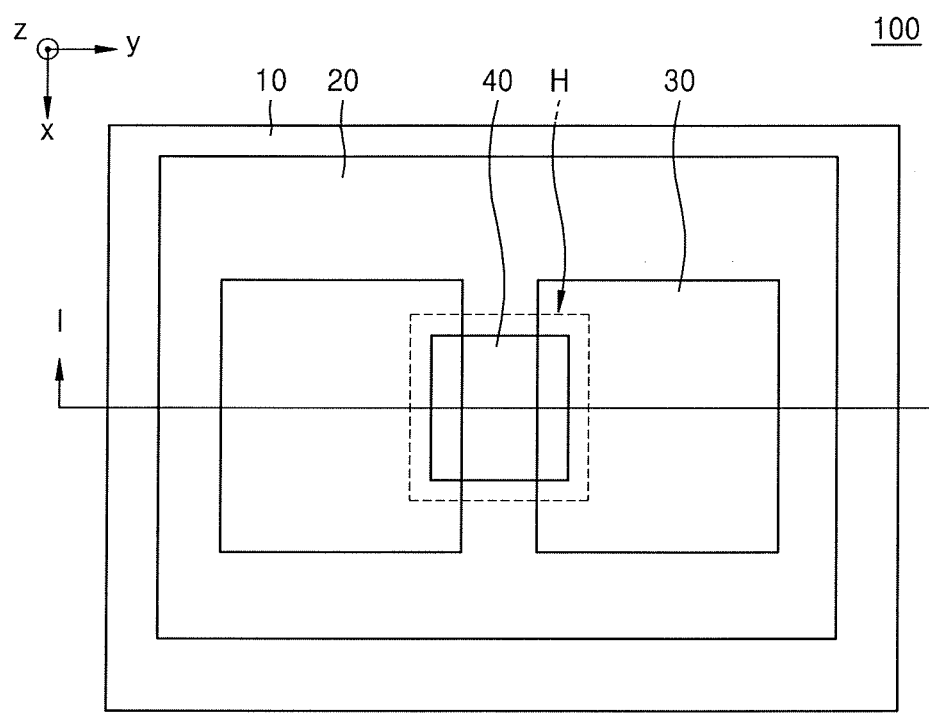
FIG. 1A is a schematic plan view illustrating a semiconductor package according to an exemplary embodiment of the present inventive concept.
Figure 1B:
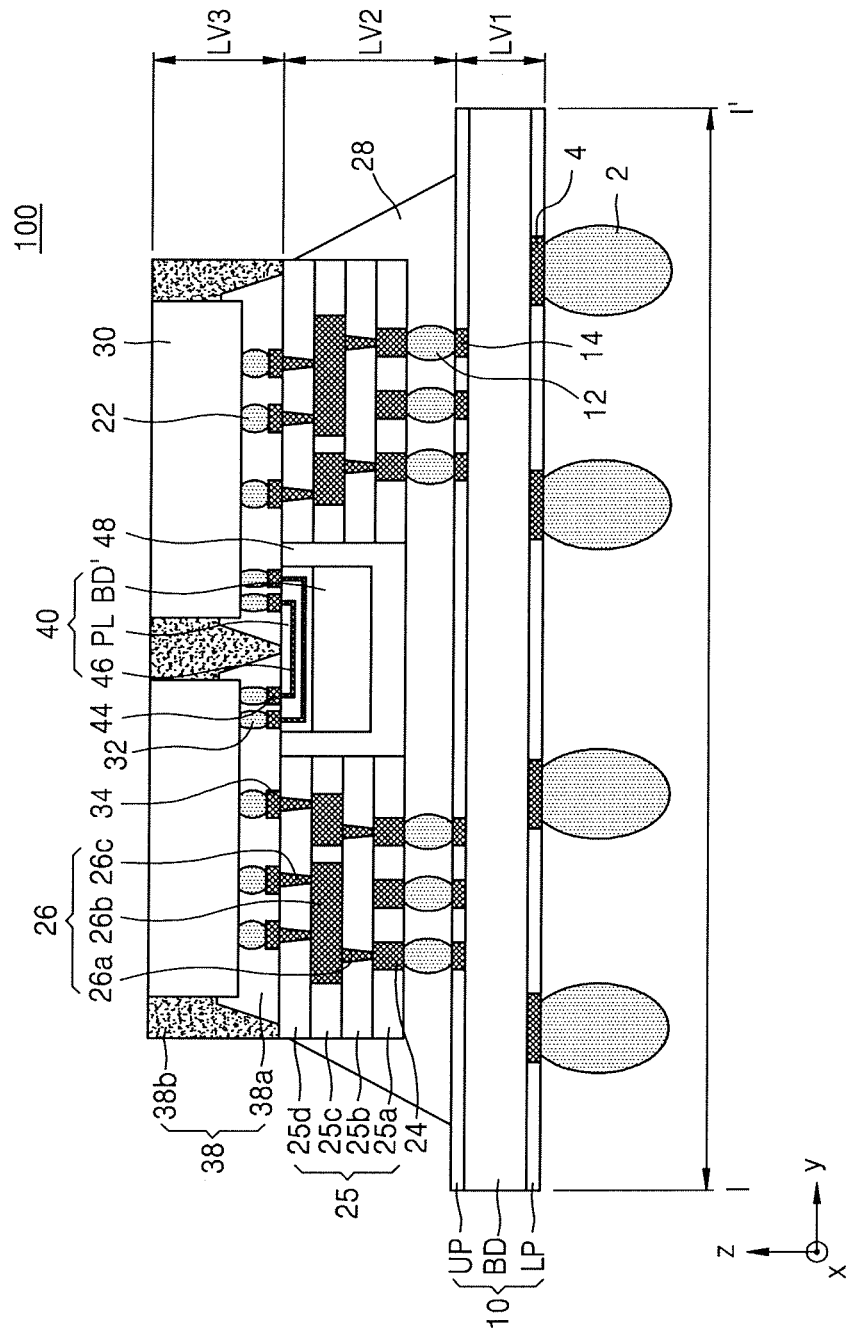
FIG. 1B is a cross-sectional view taken along a line I-I' of FIG. 1A illustrating a semiconductor package according to an exemplary embodiment of the present inventive concept.

FIG. 1A is a schematic plan view illustrating a semiconductor package according to an exemplary embodiment of the present inventive concept. FIG. 1B is a cross-sectional view taken along a line I-I' of FIG. 1A illustrating a semiconductor package according to an exemplary embodiment of the present inventive concept.

Referring to FIGS. 1A and 1B, the semiconductor package 100 may include a substrate 10. The substrate 10 may be a support substrate. The semiconductor package 100 may also include a rewiring layer 20, a second semiconductor chip 40, and a plurality of semiconductor chip stack structures 30. The rewiring layer 20, the second semiconductor chip 40, and the semiconductor chip stack structures 30 may each be disposed on the substrate 10. The substrate 10 may include a first body layer BD, a lower protection layer LP, and an upper protection layer UP. The substrate 10 may be a printed circuit board (PCB), a ceramic substrate, a glass substrate, or an interpose substrate. The substrate 10 may also be an active wafer. The active wafer may refer to a wafer in which a semiconductor chip is formed, for example, a silicon wafer.

A direction substantially perpendicular to an upper surface of the substrate 10 may be defined as a first direction (e.g., a Z-direction). Two directions substantially parallel to the upper surface of the substrate 10 may be defined as a second direction (e.g., a X-direction) and a third direction (e.g., a Y-direction), respectively. The second direction (e.g., the X-direction) and the third direction (e.g., the Y-direction) may cross each other. For example, the second direction (e.g., the X-direction) and the third direction (e.g., the Y-direction) may cross in a direction substantially perpendicular to each other. The second direction (e.g., the X-direction) and the third direction (e.g., the Y-direction) may each be substantially perpendicular to the first direction (e.g., the Z-direction). A direction indicated as an arrow and a direction opposite thereto in FIGS. 1A and 1B will be described herein as the same direction.

In the semiconductor package 100, the substrate 10 may be a PCB, for example, a molded under-fill (MUF) PCB. However, the substrate 10 is not limited thereto. An MUF process may refer to a process of sealing a boundary part of a semiconductor chip and a space part between the semiconductor chip and a PCB with substantially the same sealing resin through one-shot molding. Alternatively, the MUF process may refer to a process of sealing boundary parts of one or more semiconductor chips with substantially the same sealing resin through one-shot molding. A PCB used in the MUF process may be referred to as the MUF PCB. Wirings may be formed in the substrate 10. The substrate 10 may be configured to be electrically connected to external connection terminals 2. The substrate 10 may be electrically connected to the external connection terminals 2 through external connection pads 4. The external connection terminals 2 may be arranged on a lower surface of the substrate 10. For example, the external connection terminals 2 may be arranged on a surface opposite to a surface on which the semiconductor chip stack structures 30 are mounted.

The substrate 10 may be disposed on the module substrate or the system board through the external connection terminals 2. The external connection terminals 2 may include conductive bumps, solder balls, conductive spacers, pin grid arrays (PGAs), or solder bumps. This description may apply to a plurality of first connection terminals 12, a plurality of second connection terminals 22, and a plurality of third connection terminals 32 that will be described below.

The first body layer BD may include wiring patterns. The wiring patterns may have a multi-layered structure. Alternatively, the wiring patterns may have a single layered structure. The semiconductor package 100 may include internal connection pads 14. The internal connection pads 14 may be configured to be electrically connected to the external connection terminals 2. The internal connection pads 14 and the external connection terminals 2 may be electrically connected to each other through the wiring patterns. The semiconductor package may include a lower protection layer LP and an upper protection layer UP. The lower protection layer LP and the upper protection layer UP may each protect the first body layer BD. The lower protection layer LP and the upper protection layer UP may each include, for example, a solder resist (SR).

When the substrate 10 is a PCB, the first body layer BD may be formed by compressing phenol, epoxy glass (or FR-4) resin to a predetermined thickness, forming a thin film, coating both sides of the thin film with a copper foil, and forming a wiring pattern through patterning. The wiring pattern may be a transfer path of an electrical signal. The lower protection layer LP and the upper protection layer UP may be formed by electrically connecting wiring patterns formed on upper and lower surfaces through a via contact. The via contact may penetrate into the first body layer BD. The lower protection layer LP and the upper protection layer UP may further be formed by coating an upper surface and a lower surface of the first body layer BD with a solder resist layer. For example, substantially the entire upper and lower surfaces of the first body layer BD may be coated with the solder resist layer. The terminal connection parts might not be coated with the solder resist layer. Terminal connection parts may refer to parts in which the internal connection pads 14 and the external connection pads 4 are formed.

The external connection pads 4 and the internal connection pads 14 may include copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), or a combination/alloy thereof. The semiconductor package 100 may include first connection pads 24, second connection pads 34, and third connection pads 44. Compositions of the first to third connection pads 24, 34, and 44 may be substantially the same as compositions of the external connection pads 4 and the internal connection pads 14.

The PCB may be a single-layered PCB. The single-layered PCB may have a wiring formed on one surface thereof. Alternatively, the PCB may be a double-layered PCB. The double-layered PCB may have wirings formed on both surfaces thereof. An insulator may form at least three copper foil layers and at least three wiring layers. The insulator may be a prepreg. The insulator may form copper wiring layers according to the number of the formed copper foil layers. Thus, a PCB having multiple wiring layers may be formed. However, the substrate 10 of the semiconductor package 100 is not limited to the structure or the material of the PCB described above.

The rewiring layer 20 may be formed on the substrate 10. The rewiring layer 20 may include a plurality of insulating layers 25a, 25b, 25c, and 25d. The insulating layers 25a, 25b, 25c, and 25d may be sequentially provided on the substrate 10. The rewiring layer 20 may also include a first wiring 26. The first wiring layer 26 may be formed on the insulating layers 25a, 25b, 25c, and 25d. Although the rewiring layer 20 may include four insulating layers as illustrated in FIG. 1B, exemplary embodiments of the inventive concept are not limited thereto. For example, the rewiring layer 20 may include three or less insulating layers or at least five insulating layers. The insulating layers 25a, 25b, 25c, and 25d may include an insulating material, for example, phenol or epoxy glass (or FR-4) resin, a prepreg, Ajinomoto build-up film (ABF), or polyimide.

The first wiring 26 may include a first via 26a, a rewiring pattern 26b, and a second via 26c. The first via 26a and the second via 26c may extend in the first direction (e.g., the Z-direction). The first via 26a and the second via 26c may have a stuffed pillar shape or a cylindrical shape. Top critical dimension (CD) of the first via 26a and the second via 26c may be greater than bottom CD of the first via 26a and the second via 26c, respectively. However, exemplary embodiments of the inventive concept are not limited thereto. The rewiring pattern 26b may extend in a horizontal direction, for example, the third direction (e.g., the Y-direction). Thus, vias and a rewiring pattern may be used to form a line structure as illustrated in FIG. 1B; however, exemplary embodiments of the inventive concept are not limited thereto. Regarding a design of the circuit, the line structure may include more or less vias and rewiring patterns.

The first via 26a, the rewiring pattern 26b, and the second via 26c may include copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), or a combination/alloy thereof. The semiconductor package 100 may include a second wiring 46. A composition of the second wiring 46 may be substantially the same as compositions of the first via 26a, the rewiring pattern 26b, and the second via 26c.

The first wiring 26 may be formed through a photolithography process. Each of line and space specifications of the first wiring 26 may be more than about 2 μm. Alternatively, a half pitch of the first wiring 26 may be more than about 2 μm or one pitch thereof may be more than about 4 μm. However, exemplary embodiments of the present inventive concept are not limited thereto.

The first connection pads 24 may be formed on substantially the same level as the insulating layer 25a. Accordingly, the first connection pads 24 may be formed on a lowest layer of the insulating layers 25a, 25b, 25c, and 25d. The first connection pads 24 may electrically connect the first wiring 26 and the first connection terminals 12. Thus, the first connection pads 24 may be configured to be electrically connected to the substrate 10. The first connection pads 24 may be electrically connected to the substrate 10 through the first connection terminals 12.

The second connection pads 34 may be formed on the insulating layer 25d. Accordingly, the second connection pads 34 may be formed on the highest layer of the insulating layers 25a, 25b, 25c, and 25d. However, exemplary embodiments of the present inventive concept are not limited thereto. For example, the second connection pads 34 may be formed at substantially the same plane as the insulating layer 25d. Accordingly, the second connection pads 34 may be formed on the highest layer of the insulating layers 25a, 25b, 25c, and 25d.

The second connection pads 34 may electrically connect the first wiring 26 and the second connection terminals 22. Thus, the substrate 10 may be configured to be electrically connected to the semiconductor chip structures 30 via the first connection terminals 12, the first connection pads 24, the first wiring 26, the second connection pads 34, and the second connection terminals 22. Accordingly, sizes of the first connection pads 24 may be greater than sizes of the second connection pads 34.

The rewiring layer 20 may have a concave portion H. The concave portion H may penetrate into the rewiring layer 20. The concave portion H may be formed at substantially the same plane as the rewiring layer 20. Alternatively, a height of the concave portion H in a vertical direction may be substantially the same as a height of the rewiring layer 20 in a vertical direction. The height of the concave portion H in the vertical direction may be substantially the same as a stack height of the insulating layers 25a, 25b, 25c, and 25d. However, exemplary embodiments of the present inventive concept are not limited thereto. For example, the height of the concave portion H in the vertical direction may be smaller than the height of the rewiring layer 20 in the vertical direction. The concave portion H might not extend in some of the insulating layers 25a, 25b, 25c, and 25d. For example, the concave portion H might not extend in the insulating layer 25a. The insulating layer 25a may be the lowest layer of the insulating layers 25a, 25b, 25c, and 25d. The concave portion H may be formed by etching a plurality of insulting layer providing patterns 25p illustrated in FIG. 5E) of the rewiring layer 20. A hollow generated by etching the insulting layer providing patterns 25p may become the concave portion H. Thus, the height of the concave portion H in the vertical direction may be different according to an etching degree of the insulting layer providing patterns 25p. The rewiring layer 20 may include two stack structures. The two stack structures may be divided by the concave portion H. The second semiconductor chip 40 may be mounted in the concave portion H. Thus, a horizontal cross-sectional area of the concave portion H may be greater than a horizontal cross-sectional area of the second semiconductor chip 40.

The semiconductor chip stack structures 30 may be arranged on the rewiring layer 20. The semiconductor chip stack structures 30 may be spaced apart from each other in a horizontal direction. The semiconductor chip stack structures 30 may include a plurality of first semiconductor chips. The first semiconductor chips may be stacked in a direction substantially perpendicular to an upper surface of the substrate 10.

The first semiconductor chips may be non-volatile memory devices. Thus, the first semiconductor chips may electrically erase and program data. The first semiconductor chips may also maintain the data even if power is blocked. According to an exemplary embodiment of the present inventive concept, a NAND-type flash memory device may be provided as a non-volatile memory device. The NAND-type flash memory device may have a relatively high capacity and a relatively high speed storage capability. The first semiconductor chips may include PRAM, MRAM, ReRAM, FRAM, or NOR flash memory. The first semiconductor chips may be volatile memory devices. Thus, the first semiconductor chips may lose data when power is blocked, such as DRAM or SRAM. However, exemplary embodiments of the present inventive concept are not limited thereto. For example, the first semiconductor chips may be logic chips, measuring devices, communication devices, digital signal processors (DSPs), or system-on-chips (SoCs). The semiconductor chip stack structures 30 may include different types of first semiconductor chips.

The second semiconductor chip 40 may be inserted into the concave portion H. Thus, a horizontal cross-sectional area of the second semiconductor chip 40 may be substantially smaller than a horizontal cross-sectional area of the concave portion H. A height of the second semiconductor chip 40 in a vertical direction may be substantially smaller than a height of the concave portion H in the vertical direction. However, exemplary embodiments of the present the inventive concept are not limited thereto. For example, the height of the second semiconductor chip 40 in the vertical direction may be substantially the same as or greater than a height of the concave portion H in the vertical direction. Although one second semiconductor chip 40 may be inserted into the concave portion H as illustrated in FIGS. 1A and 1B, exemplary embodiments of the present inventive concept are not limited thereto. For example, at least two second semiconductor chips may be inserted into the concave portion H.

The second semiconductor chip 40 may include a second body layer BD', a passivation layer PL, and the second wiring 46. The second wiring 46 may be an internal wiring. The second body layer BD' may be substantially the same as the first body layer BD of the substrate 10. The second body layer BD' may be based on an active wafer. The active wafer may be a wafer other than an interpose substrate. Alternatively, the second body layer BD' may include a semiconductor chip. The semiconductor chip may be silicon (Si) based. Alternatively, the second body layer BD' may include an active element. The second body layer BD' may include a logic chip, a measuring device, a communication device, a digital signal processor (DSP), or a system on chip (SoC).

The passivation layer PL may protect the second body layer BD' from external physical and chemical damage. The passivation layer PL may protect the second body layer BD' similar to the upper protection layer UP or the lower protection layer LP. The passivation layer PL may include an oxide layer or a nitride layer. Alternatively, the passivation layer PL may include a double layer. The double layer may include the oxide layer and the nitride layer. The passivation layer PL may include an oxide layer or a nitride layer formed through a HDP-CVD (high density plasma chemical vapor deposition) process, for example, a silicon oxide ($SiO_2$) layer, and/or a silicon nitride (SiNx) layer. The insulating layer 25d that is the highest layer of the insulating layers 25a, 25b, 25c, and 25d and the passivation layer PL may be formed on substantially the same plane. However, exemplary embodiments of the present inventive concept are not limited thereto. For example, the insulating layer 25d that is the highest layer of the insulating layers 25a, 25b, 25c, and 25d and the passivation layer PL may be formed at different planes. The passivation layer PL may coat an upper surface of the second body layer BD'. The passivation layer PL may coat the upper surface of the second body layer BD' except for portions of the second body layer BD' in which the second wiring 46 is formed. The second wiring 46 may penetrate into a portion of the passivation layer PL. The passivation layer PL may be formed by being coated with the silicon oxide layer, the silicon nitride (SiNx) layer, or the double layer including the silicon oxide layer and the silicon nitride (SiNx) layer.

The third connection pads 44 may be formed on the passivation layer PL. However, exemplary embodiments of the present inventive concept are not limited thereto. For example, the third connection pads 44 may be formed on substantially the same plane as the passivation layer PL. The second connection pads 34 and the third connection pads 44 may be formed on substantially the same plane.

The second semiconductor chip 40 may be configured to be electrically connected to the third connection terminals 32. The third connection terminals 32 may be disposed between the second semiconductor chip 40 and the semiconductor chip stack structures 30. The second semiconductor chip 40 may be electrically connected to the third connection terminals 32 through the third connection pads 44. The second semiconductor chip 40 may be configured as a bridge layer. The bridge layer may electrically connect the semiconductor chip stack structures 30 spaced apart from each other in a horizontal direction to each other.

The second semiconductor chip 40 may include the second wiring 46. The second wiring 46 may be a fine line structure. The second wiring 46 may be configured to be electrically connected to the third connection pads 44. Each of line and space specifications of the second wiring 46 may be less than about 2 μm. A half pitch of the second wiring 46 may be less than about 2 μm. One pitch of the second wiring 46 may be less than about 4 μm. Alternatively, a critical dimension (CD) of the second wiring 46 may be less than about 2 μm. However, exemplary embodiments of the present inventive concept are not limited thereto.

A size of the first connection pads 24 may be greater than a size of the second connection pads 34 and the third connection pads 44. Connection pads for electrical connections with a substrate, in particular, a PCB substrate, may be larger than connection pads for electrical connections between semiconductor chips, in order to increase efficiency of contact and a degree of freedom of wiring. Furthermore, a size of the second connection pads 34 may be substantially the same as or greater than a size of the third connection pads 44. The third connection pads 44 may be connected to the second wiring 46 having the fine line structure. The fine line structure of the second wiring 46 may be relatively difficult implement by using general etching technology, such as photolithography. Thus, a size of the second connection pads 34 may be substantially the same as or greater than a size of the third connection pads 44.

A size of the first connection terminals 12 may be greater than a size of the second connection terminals 22 and the third connection terminals 32. A size of the second connection terminals 22 may be substantially the same as or greater than a size of the third connection terminals 32.

Conventional interposer technologies for connecting different semiconductor chips may include a Si-interposer, an organic interposer, a fan-out wafer level package (FO-WLP), or an embedded multi-die interconnect bridge (EMIB). The Si-interposer may have expense increase and yield problem due to a through silicon via (TSV) and barrier/seed (B/S) process. The Si-interposer may also have expense increase and yield problem due to an increase in a chip size. The organic interposer and the FO-WLP may be relatively difficult to implement the fine line structure. The organic interposer and the FO-WLP may be relatively difficult to implement the fine line structure due to a limited process caused by a warpage. The EMIB may embed a SI bridge chip in a PCB having fine and multi-pitch pads. Thus, the EMIB may cause a warpage during a process of mounting a chip having a solder bump of a fine structure on the PCB.

According to an exemplary embodiment of the present inventive concept, internal wirings of a substrate may be minimized. To minimize the internal wirings of the substrate 10, the semiconductor chip stack structures 30 and the substrate 10 may be configured to be electrically connected to each other. The semiconductor chip stack structures 30 and the substrate 10 may be configured to be electrically connected to each other by separately forming the rewiring layer 20 on the substrate 10. Furthermore, a fine line structure that may be relatively difficult to implement in the rewiring layer 20 through general etching may be implemented by mounting a bridge layer. The bridge layer may have a Si-based fine line structure, for example, the second semiconductor chip 40.

The second semiconductor chip 40 may be attached to the rewiring layer 20. The second semiconductor chip 40 may be attached to the rewiring layer 20 by an adhesion member 48. The adhesion member 48 surrounds side surfaces and lower surfaces of the second semiconductor chip 40 as illustrated in FIG. 1B; however, exemplary embodiments of the present inventive concept are not limited thereto. For example, the adhesion member 48 may be in direct contact with the side surfaces or the lower surface of the second semiconductor chip 40. The adhesion member 48 may include a non-conductive film (NCF), an anisotropic conductive film (ACF), an UV film, an instant adhesive, a thermosetting adhesive, a laser curable adhesive, an ultrasound curable adhesive, a non-conductive paste (NCP), or a die attach film (DAF). Upper surfaces of the second semiconductor chip 40, the adhesion member 48, and the insulating layer 25d that is the highest layer of the insulating layers 25a, 25b, 25c, and 25d may form substantially the same plane. However, exemplary embodiments of the present inventive concept are not limited thereto. For example, the upper surfaces of the adhesion member 48 and the second semiconductor chip 40 may be lower than the upper surface of the insulating layer 25d that is the highest layer of the insulating layers 25a, 25b, 25c, and 25d in a vertical cross-section.

A chip sealing member 38 may be configured to seal the plurality of semiconductor chip stack structures 30. The chip sealing member 38 may protect the semiconductor chip stack structures 30 from outside impurities. The chip sealing member 38 may include, for example, an epoxy molding compound (EMC), a silicon-based material, a thermosetting material, a thermoplastic material, or a UV curable material. The thermosetting material may include a phenol type curing agent, an acid anhydride type curing agent, an amine type curing agent, an acrylic polymer additive, or any combination thereof.

The chip sealing member 38 may be formed through a wafer-level molding process. The chip sealing member 38 may be formed at a wafer level. The wafer level may be disposed before a wiring package 500 as illustrated in FIG. 5H. The chip sealing member 38 may be dissembled as a unit wiring package. The unit wiring package may be disposed on a carrier 60 as illustrated in FIG. 5H. The chip sealing member 38 may include a chip under-fill 38a and a chip mold 38b. The chip under-fill 38a may be formed by using, for example, a capillary under-fill method. The chip mold 38b may cover and protect the semiconductor chip stack structures 30. The chip sealing member 38 may be formed through an MUF process. Accordingly, a material covering exposed parts, such as edges, of the first semiconductor chips and a material filling between the semiconductor chip stack structures 30 and the rewiring layer 20 may be substantially the same.

A package sealing member 28 may seal side surfaces and lower surfaces of the rewiring layer 20. The package sealing member 28 may seal side surfaces and lower surfaces of the chip sealing member 38. A composition of the package sealing member 28 may be substantially the same as a composition of the chip sealing member 38. Thus, the rewiring layer 20, the semiconductor chip stack structures 30, and the second semiconductor chip 40 may be protected from outside impurities.

The semiconductor package 100 may include the substrate 10. The substrate 10 may be formed at a first level LV1. The semiconductor package 100 may also include the semiconductor chip stack structures 30. The semiconductor chip stack structures 30 may be spaced apart from each other in a horizontal direction. The semiconductor chip stack structures 30 may be disposed at a third level LV3. The semiconductor chip stack structures 30 may be spaced in a vertical direction to the first level LV1. The semiconductor package 100 may also include the rewiring layer 20 and a bridge layer, for example, the second semiconductor chip 40. The rewiring layer 20 and the bridge layer may each be formed at a second level LV2. The second level LV2 may be disposed between the first level LV1 and the third level LV3. The rewiring layer 20 may electrically connect the substrate 10 and at least one of the semiconductor chip stack structures 30. The bridge layer, for example, the second semiconductor chip 40, may electrically connect at least one of the semiconductor chip stack structures 30 to each other. The semiconductor package 100 may include the rewiring layer 20 formed at a different level from the substrate 10. For example, the substrate may be formed at the first level LV1 and the rewiring layer 20 may be formed at the second level LV2.

Figure 2:
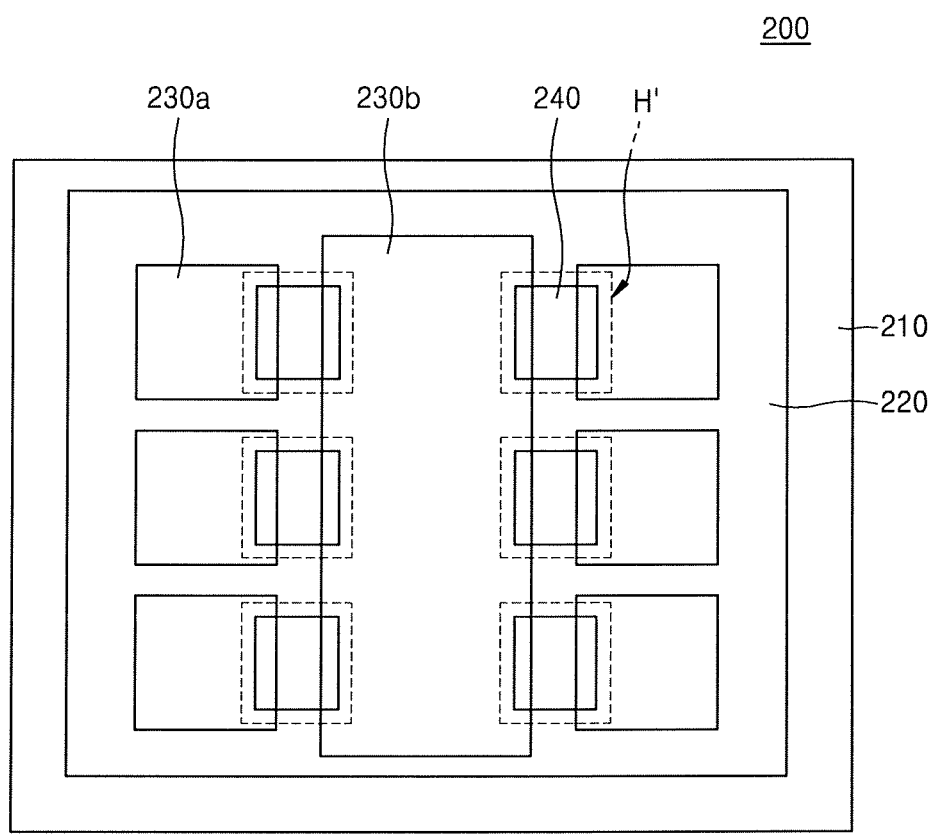
FIGS. 2 and 3 are plan views illustrating semiconductor packages according to an exemplary embodiment of the present inventive concept.

FIG. 2 is a plan view illustrating a semiconductor package according to an exemplary embodiment of the present inventive concept.

A semiconductor package 200 may include a substrate 210. The substrate 210 may be formed at a first level. The semiconductor package 200 may also include a plurality of semiconductor chip stack structures 230a and 230b. The semiconductor chip stack structures 230a and 230b may be spaced apart from each other in a horizontal direction. The semiconductor chip stack structures 230a and 230b may be formed at a third level. The semiconductor package 200 may include a rewiring layer 220 and a bridge layer, for example, a second semiconductor chip 240. The rewiring layer 220 and the bridge layer may be formed at a second level. The second level may be disposed between the first level and the third level. The rewiring layer 220 may be configured to electrically connect the substrate 210 and at least one of the semiconductor chip stack structures 230a and 230b.

The bridge layer, for example, the second semiconductor chip 240, may be inserted into the rewiring layer 220. The rewiring layer 220 may include a plurality of concave portions H'. Each of the concave portions H' may include a plurality of bridge layers, for example, the second semiconductor chips 240. The bridge layers, for example, the second semiconductor chips 240, may electrically connect at least one of the semiconductor chip stack structures 230a and 230b. The concave portions H' may be formed at the second level. The second semiconductor chips 240 may be inserted into the concave portions H', respectively. The second semiconductor chips 240 may be arranged at the second level. Although sizes or shapes of the concave portions H' may be substantially the same to each other as illustrated in FIG. 2, exemplary embodiments of the present inventive concept are not limited thereto. Sizes or shapes of the concave portions H' may be modified according to sizes of the second semiconductor chips 240 respectively inserted into the concave portions H'. Sizes or shapes of the concave portions H' may also be modified according to locational relationships between the semiconductor chip stack structures 230a and 230b.

The semiconductor chip stack structures 230a and 230b may include first semiconductor chip stack structures 230a and a second semiconductor chip stack structure 230b. Each of the first semiconductor chip stack structures 230a may be configured to electrically connect the second semiconductor chip stack structure 230b to each other through the bridge layer. According to an exemplary embodiment of the present inventive concept, for example, the first semiconductor chip stack structures 230a may be a stack of the above-described memory chips. The second semiconductor chip stack structure 230b may include an active element, a logic chip, or an application specific integrated circuit (ASIC).

Figure 3:
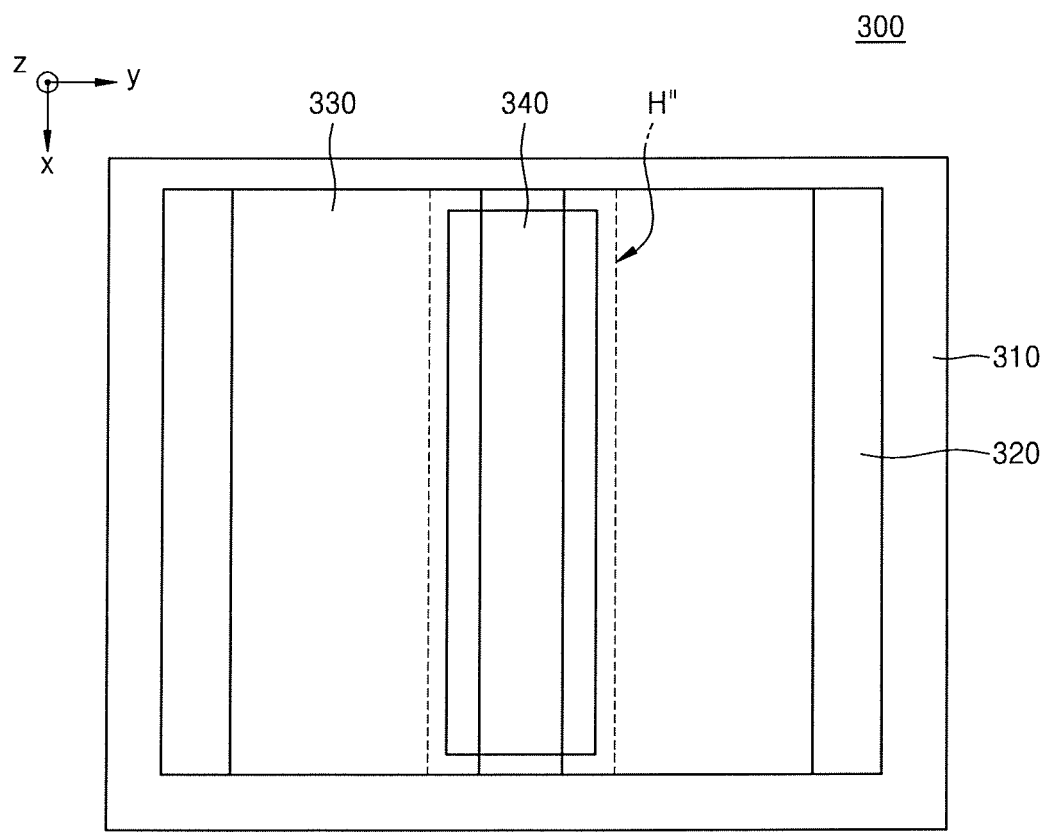

FIG. 3 is a plan view illustrating a semiconductor package according to an exemplary embodiment of the present inventive concept.

A semiconductor package 300 may include a substrate 310. The substrate 310 may be formed at a first level. The semiconductor package 300 may also include a plurality of semiconductor chip stack structures 330. The semiconductor chip stack structures 330 may be spaced apart from each other in a horizontal direction. The semiconductor chip stack structures 330 may be formed at a third level. The semiconductor package 300 may also include a rewiring layer 320 and a bridge layer, for example, a second semiconductor chip 340. The rewiring layer 320 and the bridge layer, for example, the second semiconductor chip 340, may be formed at a second level. The second level may be disposed between the first level and the third level.

A concave portion H" may be formed at substantially the same level as the rewiring layer 320. A length of the concave portion H" and a length of the rewiring layer 320 may be substantially the same in a second direction (e.g., an X-direction). The second direction (e.g., the X-direction) may be a direction substantially horizontal to an upper surface of the substrate 310. When a height of the concave portion H" and a height of the rewiring layer 320 in a vertical direction are substantially the same, the rewiring layer 320 may be divided into two regions. The rewiring layer 320 may be divided into two regions by the concave portion H". The semiconductor package 300 may include a plurality of rewiring layers 320. The rewiring layers 320 may be spaced in a horizontal direction. Empty spaces disposed between the plurality of rewiring layers 320, for example, hollows, may refer to the concave portions H". The second semiconductor chips 340 may be arranged between adjacent rewiring layers 320.

Referring to FIGS. 2 and 3, the rewiring layers 220 and 320, locations and shapes of the concave portions H' and H", and arrangements of the second semiconductor chips 240 and 340 may vary, for example, in accordance with product properties and design considerations.

Figure 4:
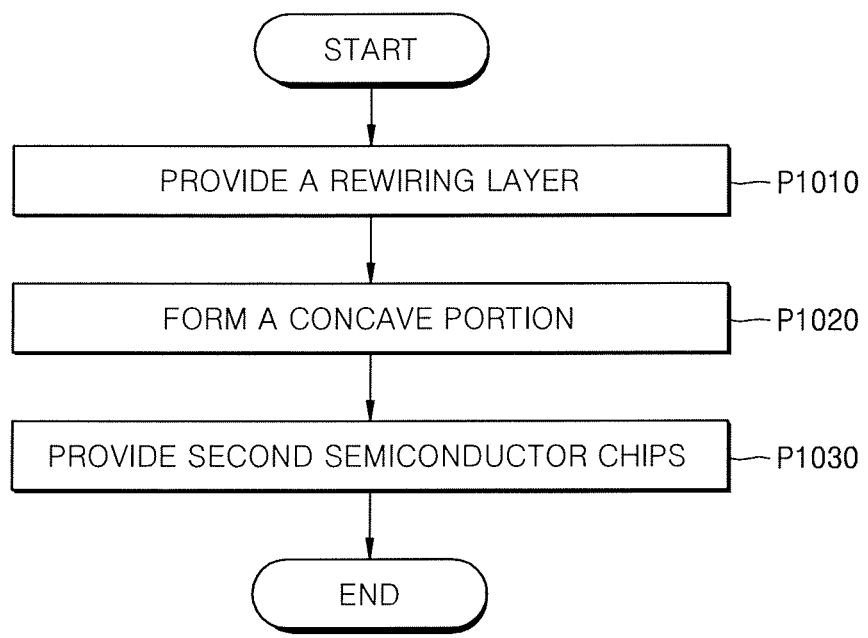
FIG. 4 is a schematic flowchart illustrating a process of forming a semiconductor package according to an exemplary embodiment of the present inventive concept.

FIG. 4 is a schematic flowchart illustrating a process of forming a semiconductor package according to an exemplary embodiment of the present inventive concept. FIGS. 5A to 5H are cross-sectional views of FIG. 1B illustrating a method of manufacturing a semiconductor package according to an exemplary embodiment of the present inventive concept.

Figure 5A:
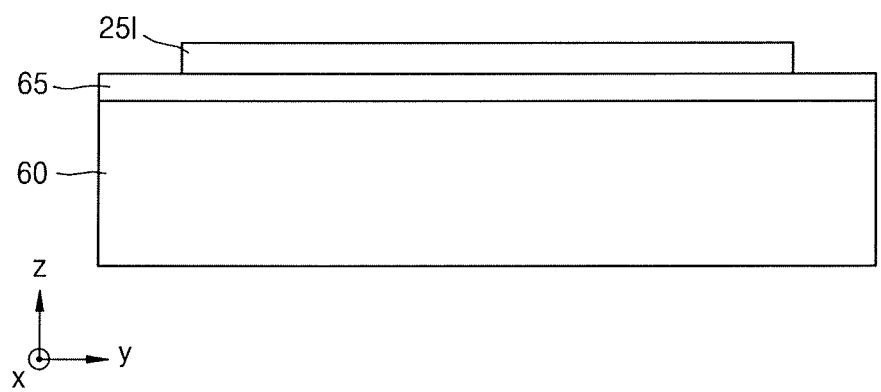
FIGS. 5A to 5H are cross-sectional views of FIG. 1B illustrating a method of manufacturing a semiconductor package according to an exemplary embodiment of the present invention.

Referring to FIGS. 4 and 5A, in a process P1010 of providing a rewiring layer, a carrier fixing layer 65 and the carrier 60 may be provided. The carrier 60 may be a rigid body, for example, a quartz substrate, a glass substrate, a semiconductor substrate, a ceramic substrate, or a metal substrate. The carrier 60 may include a relatively rigid material. The carrier 60 may have a mechanical rigidity. The carrier 60 may support a rewiring layer that is being formed. Thus, the carrier 60 may facilitate a process of forming the rewiring layer. The carrier 60 may perform a wafer level process. The wafer level process may minimize an occurrence of a warpage. A thickness of the carrier 60 may range from about 100 μm to about 1,000 μm. However, the thickness of the carrier 60 is not limited thereto. For example, the thickness of the carrier 60 may be smaller than about 100 μm or greater than about 1,000 μm. Performing a manufacturing process at a wafer level may refer to directly mounting a semiconductor chip on a wafer in a wafer state. Performing a manufacturing process at a wafer level may also refer to performing a trimming process or a grinding process. Performing a manufacturing process at a wafer level may also refer to performing a manufacturing process after cutting the wafer into individual base chips or individual chips and rearranging individual base chips or individual chips on a support substrate of a wafer size.

The carrier fixing layer 65 may be formed on the carrier 60. The carrier fixing layer 65 may affix an insulating layer providing layer 251 to the carrier 60. Thus, the carrier fixing layer 65 may include an adhesive material. The carrier fixing layer 65 may be an adhesion layer. The adhesion layer may affixes the insulating layer providing layer 251 to the carrier 60. The adhesion layer may include glue. The carrier fixing layer 65 may include a polymer. For example. The carrier fixing layer 65 may include siloxane. The carrier fixing layer 65 may include siloxane including a phenol group. Alternatively, the carrier fixing layer 65 may be cross-linked through epoxy. For example, the carrier fixing layer 65 may include a polymer in which epoxy is used as a cross-linker in the siloxane including the phenol group.

The carrier fixing layer 65 may be formed by using a spin on deposition (SOD) method. Thus, the carrier fixing layer 65 may be substantially uniformly coated on the carrier 60; however, exemplary embodiments of the present inventive concept are not limited thereto.

A release layer may be provided on the carrier fixing layer 65. The release layer may separate the carrier 60 from the rewiring layer 20 as illustrated in FIG. 5D. The release layer may separate the carrier 60 from the rewiring layer 20 after a manufacturing process including the carrier 60. However, during the manufacturing process including the carrier 60, the release layer may also affix to each of the carrier 60 and the rewiring layer 20 as illustrated in FIG. 5D. The release layer may include a polymer. The release layer may include siloxane.

The insulating layer providing layer 251 may be provided on the carrier fixing layer 65. Chemical vapor deposition (CVD), for example, may be used to substantially uniformly provide the insulating layer providing layer 251 on the carrier fixing layer 65. However, exemplary embodiments of the present inventive concept are not limited thereto. For example, the insulating layer providing layer 251 may be provided by using SOD, physical vapor deposition (PVD), or atomic layer deposition (ALD). The insulating layer providing layer 251 may have substantially the same composition as the composition of the insulating layers 25a, 25b, 25c, and 25d described with reference to FIGS. 1A and 1B.

Figure 5B:
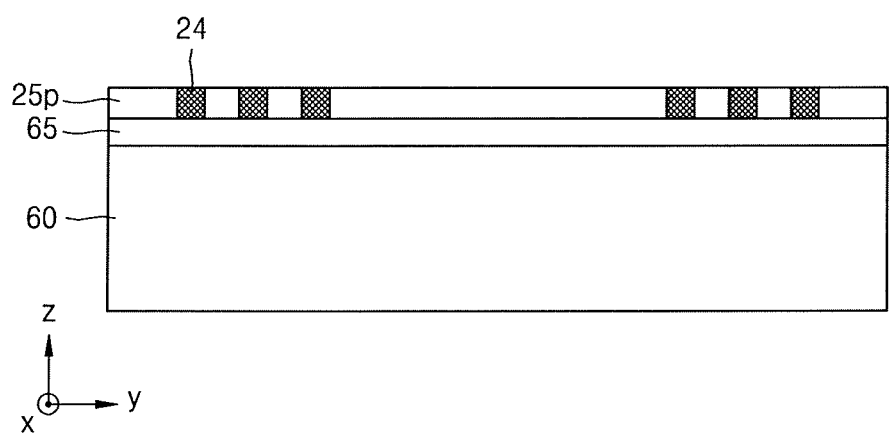

Referring to FIGS. 4 and 5B, in the process P1010, an insulating layer providing pattern 25p may be provided. A photo resist may be coated on the insulating layer providing layer 251. The insulating layer providing layer 251 may be patterned. The insulating layer providing layer 251 may be pattered through exposure and development. Thus a photo resist pattern may be formed. A region in which the first connection pads 24 are to be formed may be defined by the photo resist pattern. The insulating layer providing layer 251 may then be etched. The insulating layer providing layer 251 may be etched until an upper surface of the carrier fixing layer 65 is exposed. The insulating layer providing layer 251 may be etched using the photo resist pattern as an etching mask. Thus, the insulating layer providing pattern 25p may be formed.

A conductive material layer may then be provided on the insulating layer providing pattern 25p. The conductive material layer may substantially conformably fill hollows formed in the insulating layer providing pattern 25p. Chemical mechanical polishing (CMP) may be performed by using an upper surface of the insulating layer providing pattern 25p as an etching stop layer. Thus, the first connection pads 24 may be formed. Accordingly, the first connection pads 24 and the insulating layer providing pattern 25p may have substantially the same height. The upper surface of the insulating layer providing pattern 25p may be partially etched during a CMP process.

Figure 5C:
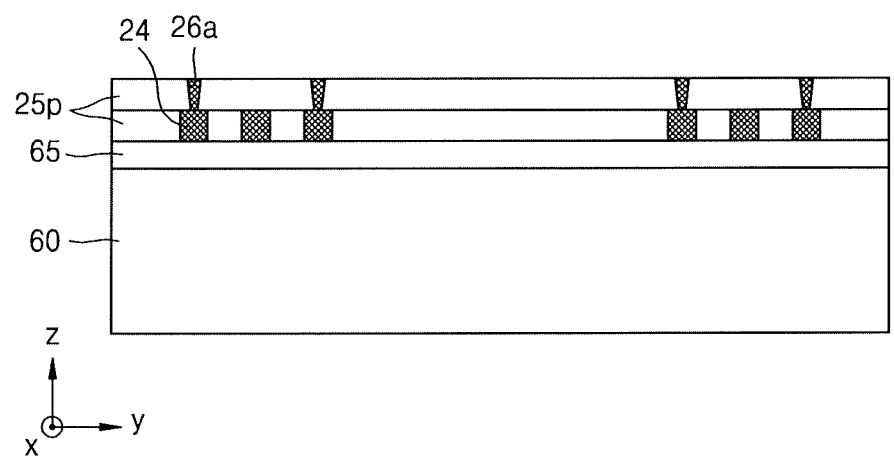
Figure 5D:
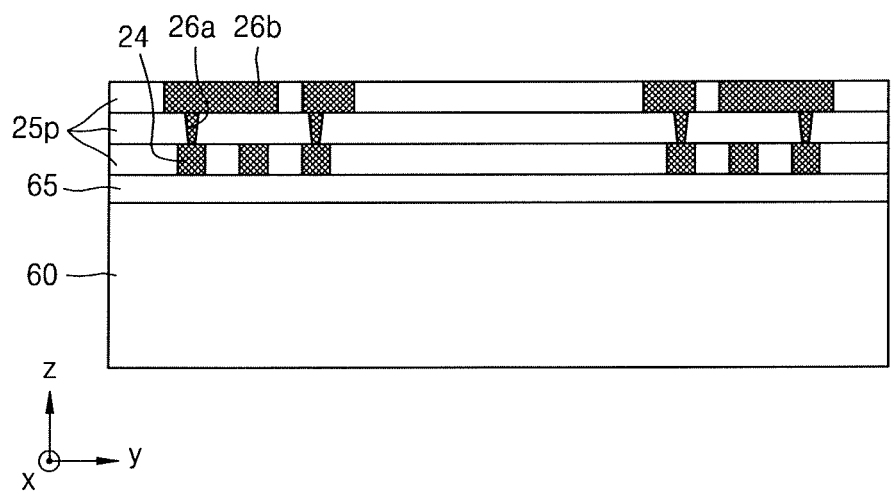

Referring to FIGS. 4 and 5C, in the process P1010, the insulating layer providing pattern 25p and the first via 26a may be provided substantially the same as described with reference to FIG. 5B. After an insulating layer providing layer is provided on the insulating layer providing layer 25p at substantially the same level as the first connection pads 24, a photo resist pattern may be formed on the insulating layer providing pattern 25p. The photo resist pattern may define the first via 26a in the insulating layer providing layer. The insulating layer providing layer may then be etched by using the photo resist pattern as an etching mask. The insulating layer providing layer may be etched until an upper surface of the first connection pads 24 is exposed. The first via 26a may be formed in a first direction (e.g., a Z-direction). The first via 26a and the insulating layer providing pattern 25p may be provided by performing a CMP process as described with reference to FIG. 5B.

Referring to FIGS. 4 and 5D, in the process P1010, as described with reference to FIG. 5B or 5C, the insulating layer providing pattern 25p and the rewiring pattern 26b may be provided. The rewiring pattern 26b may be formed in a third direction (e.g., a Y-direction); however, exemplary embodiments of the present inventive concept are not limited thereto. For example, the rewiring pattern 26b may be formed in a second direction (e.g., an X-direction).

Figure 5E:
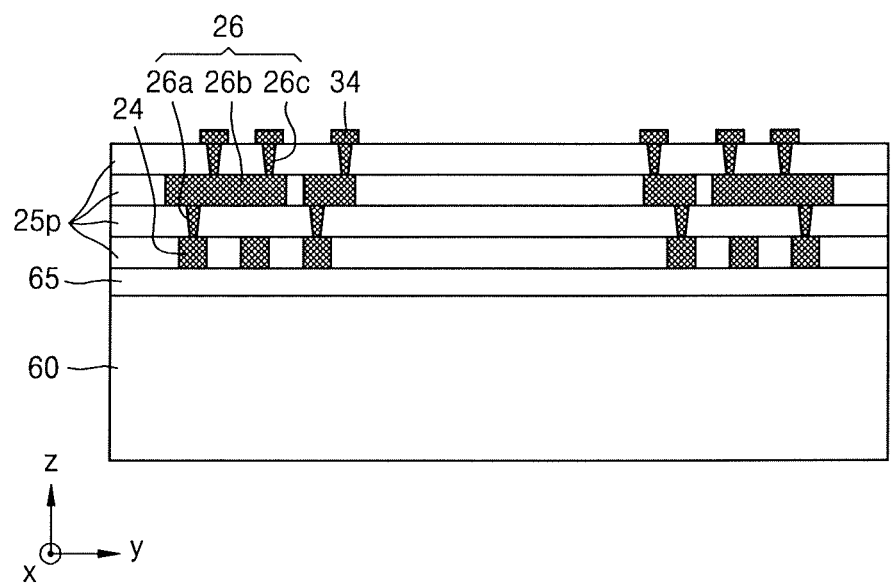

Referring to FIGS. 4 and 5E, in the process P1010, as described with reference to FIG. 5B, the insulating layer providing pattern 25p, the first wiring 26, and the second connection pads 34 may be provided. Adjoining layers that may combine the insulating layer providing patterns 25p with each other may be provided. The adjoining layers may be provided between the insulating layer providing patterns 25p. The adjoining layers may include an NCF, an ACF, an UV film, an instant adhesive, a thermosetting adhesive, a laser curable adhesive, an ultrasound curable adhesive, an NCP, or a DAF.

A sacrificial layer may be formed on the insulating layer providing patterns 25p. The sacrificial layer may have an etching selectivity with respect to the insulating layer providing patters 25p. After the sacrificial layer is formed, the second connection pads 34 may be provided as described with reference to FIG. 5B. The sacrificial layer may then be removed. The sacrificial layers may be removed by using a wet etching method.

Figure 5F:
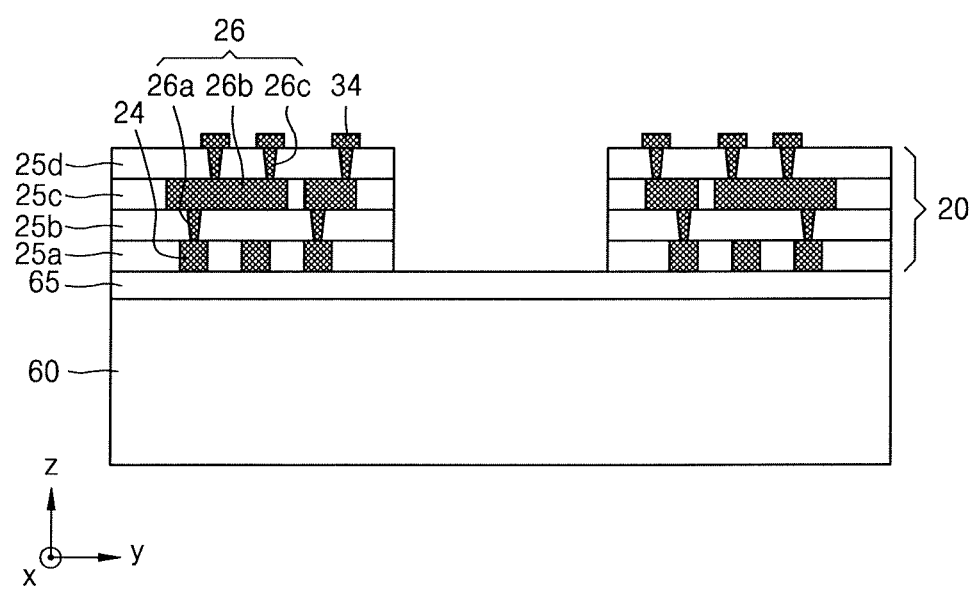

When an insulating layer providing layer other than the sacrificial layer is provided to form the second connection pads 34, the second connection pads 34 may be formed at substantially the same level as the insulating layer providing pattern 25p of the highest layer in a vertical cross-section. The insulating layer providing pattern 25p of the highest layer may have a thickness smaller than a thickness of the other insulating layer providing patterns 25p. The insulating layer providing pattern 25p of the highest layer may include the second connection pads 34. The second connection pads 34 may be connected to the semiconductor chip stack structures 30 as illustrated in FIG. 5F. Sizes of the second connection pads 34 may be smaller than sizes of the first connection pads 24. The second connection pads 34 may have a height substantially the same as a height of the insulating layer providing pattern 25p of the highest layer.

Forming of the first wiring 26 as described with reference to FIGS. 5B to 5E is an exemplary embodiment of the present inventive concept; however, exemplary embodiments of the present inventive concept are not limited thereto. The forming of the first wiring 26 may be modified, for example, according to a design of a semiconductor package.

Referring to FIGS. 4 and 5F, in a process P1020, the concave portion H may be formed. The concave portion H may be formed similar to the photolithography method described with reference to FIG. 5A. However, before a photo resist is formed, a hard mask layer may be formed. The hard mask layer may include an amorphous carbon layer or a polysilicon layer. An anti-reflective coating may be formed on the hard mask layer. A photo resist pattern may be formed by patterning the photo resist. The photo resist may be patterned through exposure and development. Thereafter, a hard mask pattern may be formed by etching the hard mask layer. The hard mask layer may be etched by using the photo resist pattern as an etching mask. After the photo resist pattern is removed, the hard mask pattern may be formed on the insulating layer providing pattern 25p of the highest layer. The hard mask pattern may be formed on the insulating layer providing pattern 25a excluding a part in which the concave portion H is formed. The concave portion H may be formed by using the hard mask pattern as the etching mask. The insulating layer providing patterns 25p may then be etched by using the hard mask pattern as the etching mask. However, the exemplary embodiments of the present inventive concept are not limited thereto. The insulating layer providing patterns 25p may be etched by using the hard mask pattern as the etching mask without the hard mask layer. Accordingly, the insulating layer providing patterns 25p may become the insulating layers 25a, 25b, 25c, and 25d.

Figure 5G:
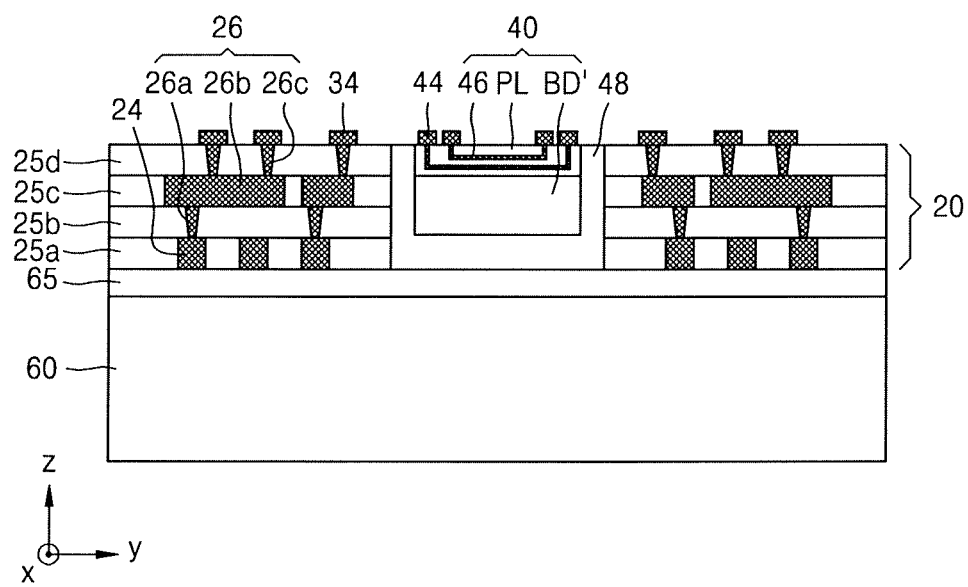
Figure 5H:
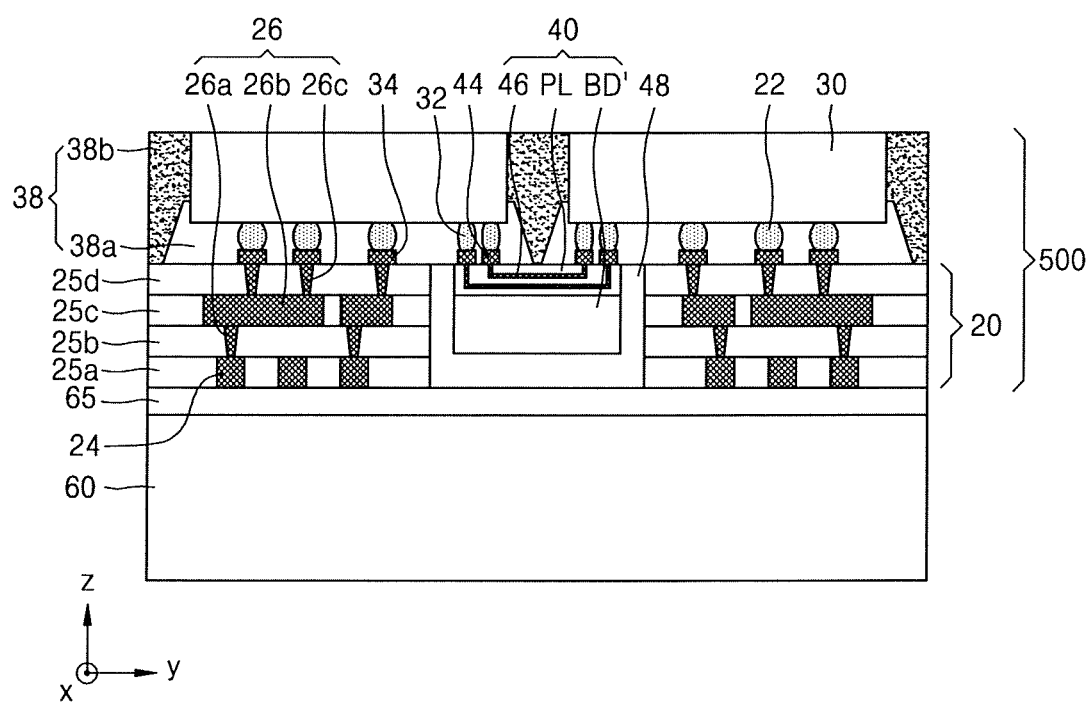

Referring to FIGS. 4 and 5G, in a process P1030, the second semiconductor chip 40 may be provided in the concave portion H. When the second semiconductor chip 40 is provided, a method of providing an amount of the adhesion member 48 to the concave portion H and compressing the second semiconductor chip 40 to the adhesion member 48 may be performed. A process of providing the second semiconductor chip 40 may be performed at a wafer level, for example, through a chip on wafer (COW) process. With respect to an array of a plurality of rewiring layers formed on the carrier 60, the second semiconductor chip 40 may be inserted into the concave portion H before each of the rewiring layers is individualized. The second semiconductor chip 40 may be inserted at the wafer level mounted on the carrier 60. Thus a processing efficiency may be increased and a warpage that may be applied to the rewiring layer 20 or the second semiconductor chip 40 may be minimized. However, exemplary embodiments of the present the inventive concept are not limited thereto. The second semiconductor chip 40 may be provided after an individualization process.

Referring to FIGS. 4 and 5H, the semiconductor chip stack structures 30 may be provided. The second connection terminals 22 may be configured to electrically connect the semiconductor chip stack structures 30 and the rewiring layer 20. The third connection terminals 32 may be configured to electrically connect the semiconductor chip stack structures 30 and the second semiconductor chip 40. The semiconductor chip stack structures 30 may also be provided at the wafer level. Thus a processing efficiency may be increased and a warpage may be minimized. However, exemplary embodiments of the present inventive concept are not limited thereto. The semiconductor chip stack structures 30 may be provided after an individualization process.

The chip sealing member 38 may then be provided. The chip sealing member 38 may protect the semiconductor chip stack structures 30. The chip sealing member 38 may include the chip under-fill 38a and the chip mold 38b. The chip under-fill 38a may be provided by using a capillary under-fill method. The chip mold 38b may be provided to cover and protect upper surfaces and side surfaces of the semiconductor chip stack structures 30. However, exemplary embodiments of the present inventive concept are not limited thereto. For example, the hip sealing member 38 may be formed through an MUF process. A structure including the rewiring layer 20, the semiconductor chip stack structures 30, the chip sealing member 38, the adhesion member 48, and the second semiconductor chip 40 may be referred to as the wiring package 500.

Referring to FIG. 1B, the semiconductor package 100 may be provided by mounting the wiring package 500 as illustrated in FIG. 5H on the substrate 10.

The unit wiring package 500 may be produced by performing an individualization process of dicing the wiring package 500 illustrated in FIG. 5H into unit structures. The unit wiring package 500 may then be mounted on the substrate 10. The unit wiring package 500 may be configured to be electrically connected to the substrate 10. The unit wiring package 500 may be electrically connected to the substrate 10 via the first connection terminal 12 as illustrated in FIG. 1B and the internal connection pads 14. The package sealing member 28 may protect the wiring package 500 from external damage factors. The package sealing member 28 may be provided through an under-fill process, for example, an MUF process.

FIGS. 6A to 6D are cross-sectional views illustrating a method of manufacturing a semiconductor package according to an exemplary embodiment of the present inventive concept.

Figure 6A:
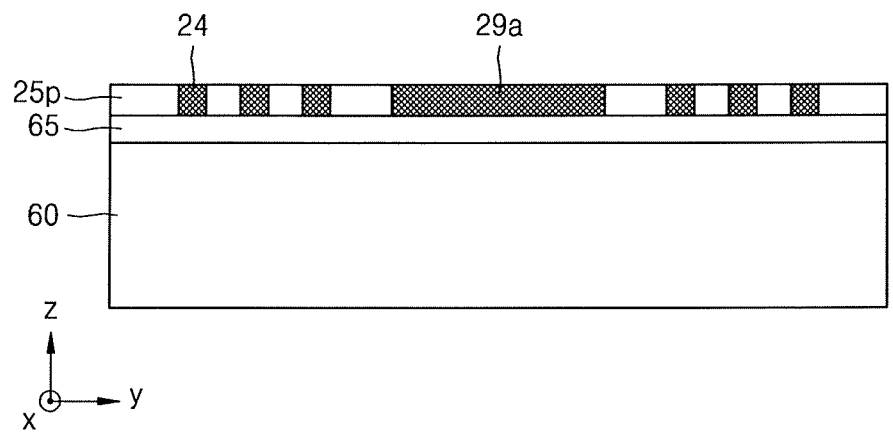
FIGS. 6A to 6D are cross-sectional views illustrating a method of manufacturing a semiconductor package according to an exemplary embodiment of the present inventive concept.

Referring to FIG. 6A, a part in which a concave portion is to be formed may be etched during an etching process. The etching process may include a photo resist pattern. A conductive material layer may be provided on an insulating layer providing layer. The concave portion H as illustrated in FIG. 1B may be formed on the insulating layer providing layer. The conductive material layer may substantially conformably fill hollows formed in the insulating layer providing pattern 25p. Thereafter, CMP may be performed by using an upper surface of the insulating layer 25a as an etching stop layer. Thus, the first connection pads 24 and a sacrificial pattern 29a may be formed.

Figure 6B:
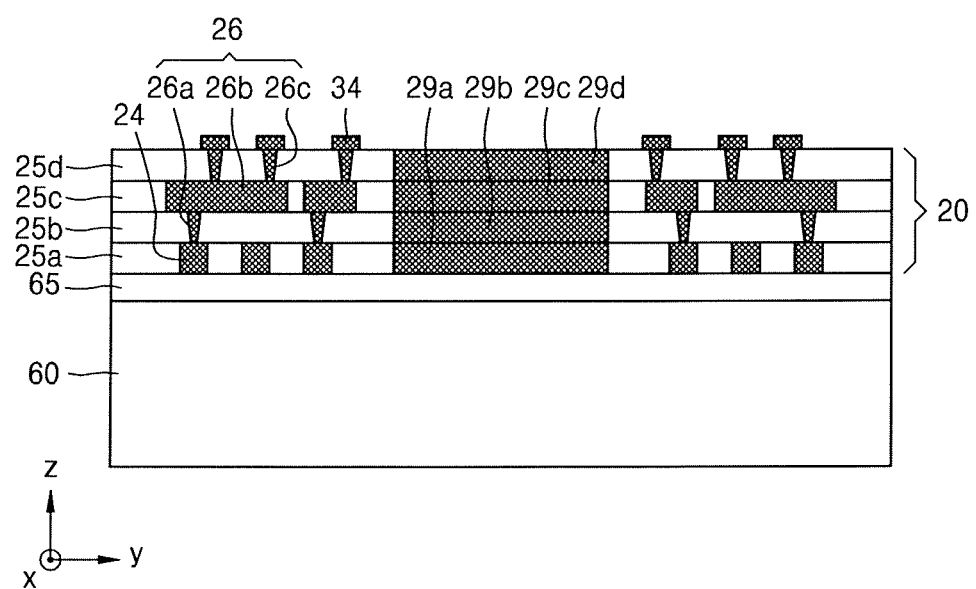

Referring to FIG. 6B, similarly as described with reference to FIG. 6A, when the insulating layer providing layers are etched to form the first rewiring 26 and the second connection pads 34, a part in which a concave portion is to be formed may be etched. Accordingly, hollows in which sacrificial patterns 29b, 29c and 29d are to be respectively formed in the insulating layer providing layers may be defined. Thus, the sacrificial patterns 29b, 29c and 29d may be formed when the first rewiring 26 and the second connection pads 34 are formed.

Figure 6C:
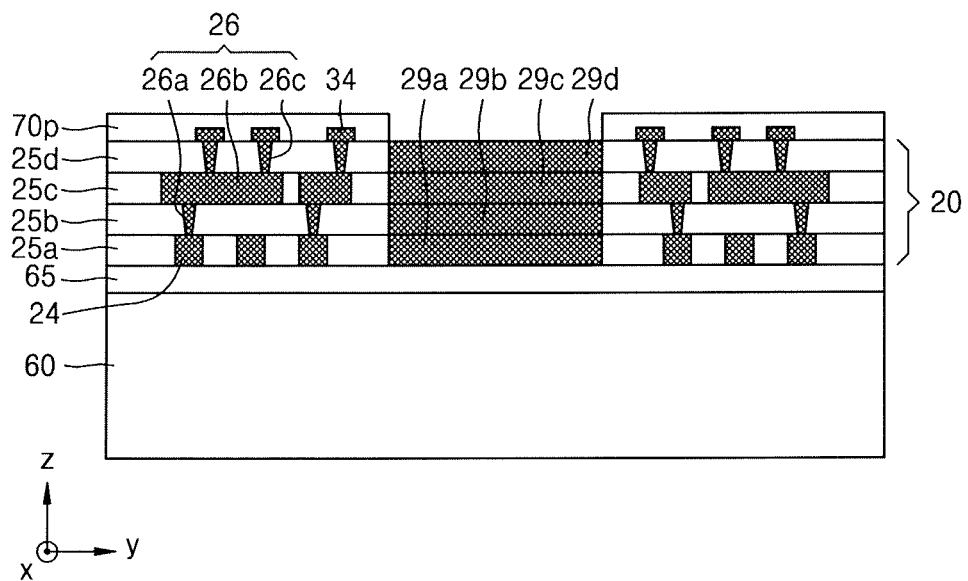

Referring to FIG. 6C, a mask layer pattern 70p may be formed on the insulating layer 25d of the highest layer. The mask layer pattern 70p may prevent the second connection pads 34 exposed during a process of removing a sacrificial pattern from being damaged due to, for example, a wet etching liquid. Thus, the mask layer pattern 70p may include a material having an etching selectivity with respect to the sacrificial patterns 29b, 29c, and 29d. The mask layer pattern 70p may be substantially conformably formed on the insulating layer 25d of the highest layer and the second connection pads 34. Thus the mask layer pattern 70p formed on the second connection pads 34 may include an unevenness.

Figure 6D:
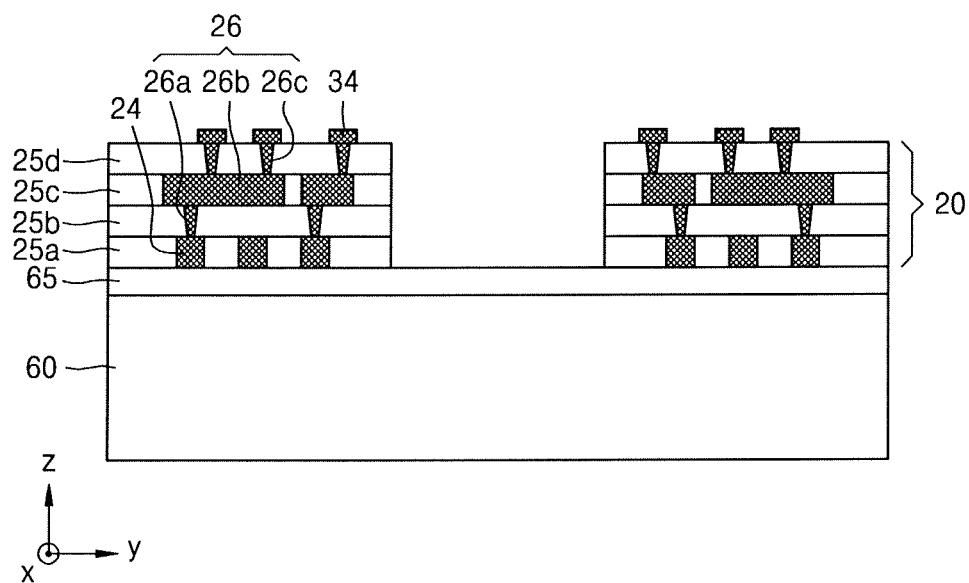

Referring to FIG. 6D, the sacrificial patterns 29b, 29c and 29d may be removed, for example, through wet etching. However, exemplary embodiments of the present inventive concept are not limited thereto. For example, the sacrificial patterns 29b, 29c, and 29d may be removed through dry etching. The mask layer pattern 70p may be removed after the sacrificial patterns 29b, 29c, and 29d are removed.

The semiconductor packages 100, 200, and 300 may be provided through substantially the same process as described with reference to FIGS. 5G and 5H.

While exemplary embodiments of the present inventive concept have been particularly shown and described with reference to embodiments thereof, it will be understood that various changes in form and details may be made therein without departing from the spirit and scope of the present inventive concept.

What is claimed is:

1. A semiconductor package, comprising:
a substrate;
a rewiring layer disposed on an upper surface of the substrate, the rewiring layer comprising a concave portion and a first wiring;
a plurality of semiconductor chip stack structures comprising a plurality of first semiconductor chips disposed on the rewiring layer and spaced apart from each other in a horizontal direction; and
a second semiconductor chip disposed within the concave portion and including a second wiring,
wherein the second semiconductor chip is configured to electrically connect each of the plurality of semiconductor chip stack structures to each other, and
wherein a line width of the first wiring is greater than a line width of the second wiring.

2. The semiconductor package of claim 1, wherein the concave portion is disposed in a surface of the rewiring layer facing the first semiconductor chips.

3. The semiconductor package of claim 1, wherein the concave portion penetrates into the rewiring layer.

4. The semiconductor package of claim 1, further comprising an adhesion member disposed in the concave portion, wherein the adhesion member attaches the rewiring layer to the second semiconductor chip.

5. The semiconductor package of claim 4, wherein the second semiconductor chip is an active element.

6. The semiconductor package of claim 5, further comprising:
a plurality of first connection terminals disposed between the rewiring layer and the substrate;
a plurality of second connection terminals disposed between the rewiring layer and the semiconductor chip stack structures; and
a plurality of third connection terminals disposed between the second semiconductor chip and the semiconductor chip stack structures,
wherein the first connection terminals are larger than the second connection terminals.

7. The semiconductor package of claim 6, wherein the second connection terminals are larger than the third connection terminals.

8. The semiconductor package of claim 6, further comprising:
a plurality of first connection pads arranged on a surface of the rewiring layer facing the substrate and electrically connected to the first connection terminals;
a plurality of second connection pads arranged on a surface of the rewiring layer facing the semiconductor chip stack structures and electrically connected to the second connection terminals; and
a plurality of third connection pads arranged on a surface of the second semiconductor chip facing the semiconductor chip stack structures and electrically connected to the third connection terminals,
wherein the first connection pads are larger than the second connection pads.

9. The semiconductor package of claim 8, wherein the second connection pads are larger than the third connection pads.

10. The semiconductor package of claim 1, wherein the line width of the second wiring is less than about 2 μm.

11. A semiconductor package, comprising:
a substrate formed at a first level;

a plurality of semiconductor chip stack structures formed at a third level and spaced apart from each other in a horizontal direction;

a first rewiring layer formed at a second level, the second level disposed between the first level and the third level and electrically connecting the substrate and at least one of the semiconductor chip stack structures and the first rewiring layer including a first wiring; and a bridge layer formed at the second level and electrically connecting at least one of the semiconductor chip stack structures and including a second wiring, wherein a line width of the first wiring is greater than a line width of the second wiring.

12. The semiconductor package of claim 11, wherein the bridge layer is disposed within the first rewiring layer.

13. The semiconductor package of claim 11, further comprising a second rewiring layer formed at the second level, wherein the second rewiring layer is spaced apart from the first rewiring layer, and electrically connects the substrate and at least one of the semiconductor chip stack structures.

14. The semiconductor package of claim 13, wherein the bridge layer is disposed between the first rewiring layer and the second rewiring layer.

15. A semiconductor package, comprising:
a substrate;
a rewiring layer disposed on the substrate, the rewiring layer comprising a concave portion and a first wiring;
a plurality of semiconductor chip stack structures disposed on the rewiring layer; and
a second semiconductor chip disposed within the concave portion and including a second wiring,
wherein the second semiconductor chip is configured to electrically connect the semiconductor chip stack structures to each other, and
wherein a line width of the first wiring is greater than a line width of the second wiring.

16. The semiconductor package of claim 15, wherein the concave portion is disposed in a surface of the rewiring layer facing the semiconductor chip stack structures.

17. The semiconductor package of claim 15, wherein the concave portion penetrates into the rewiring layer.

18. The semiconductor package of claim 15, further comprising an adhesion member disposed in the concave portion, wherein the adhesion member attaches the rewiring layer to the second semiconductor chip.

19. The semiconductor package of claim 15, wherein a horizontal cross-sectional area of the second semiconductor chip is smaller than a horizontal cross-sectional area of the concave portion.

* * * * *